(12) United States Patent
Rutkowski et al.

(10) Patent No.: US 10,079,377 B2
(45) Date of Patent: Sep. 18, 2018

(54) SYSTEM AND METHOD FOR CONTROLLING OUTPUT OF A BATTERY PACK

(75) Inventors: Brian D. Rutkowski, Ypsilanti, MI (US); Brian C. Moorhead, Willis, MI (US)

(73) Assignee: A123 Systems, LLC, Waltham, MA (US)

( * ) Notice: Subject to any disclaimer, the term of this patent is extended or adjusted under 35 U.S.C. 154(b) by 1916 days.

(21) Appl. No.: 13/376,569

(22) PCT Filed: Jun. 8, 2010

(86) PCT No.: PCT/US2010/037712
§ 371 (c)(1),
(2), (4) Date: Dec. 19, 2011

(87) PCT Pub. No.: WO2010/144401
PCT Pub. Date: Dec. 16, 2010

(65) Prior Publication Data
US 2012/0098543 A1    Apr. 26, 2012

Related U.S. Application Data

(60) Provisional application No. 61/185,772, filed on Jun. 10, 2009.

(51) Int. Cl.
*H02J 7/00* (2006.01)
*H01M 2/10* (2006.01)
(Continued)

(52) U.S. Cl.
CPC ....... *H01M 2/1077* (2013.01); *B60L 11/1861* (2013.01); *H01M 10/48* (2013.01); *H01M 10/486* (2013.01); *B60W 2510/244* (2013.01); *G01R 31/3658* (2013.01); *Y02T 10/7005* (2013.01); *Y02T 10/705* (2013.01); *Y02T 10/7044* (2013.01); *Y02T 90/16* (2013.01)

(58) Field of Classification Search
USPC ....................................................... 320/136
See application file for complete search history.

(56) References Cited

U.S. PATENT DOCUMENTS 6,252,377 B1 *  6/2001  Shibutani et al. ............ 320/132
6,888,468 B2    5/2005  Bertness
(Continued)

FOREIGN PATENT DOCUMENTS

CN        101009883 A    8/2007
JP        2003143765 A   5/2003
(Continued)

OTHER PUBLICATIONS

ISA Korean Intellectual Property Office, International Search Report of PCT/US2010/037712, dated Feb. 8, 2011, 3 pages.

*Primary Examiner* — Robert Grant
(74) *Attorney, Agent, or Firm* — McCoy Russell LLP

(57) ABSTRACT

Systems and methods for communicating a state of a battery to a vehicle controller are disclosed. In one example, a battery pack outputs a signal indicative of an amount of capability the battery pack has to source or sink current at present operating conditions. The system and method may improve vehicle drivability and reduce battery pack degradation.

20 Claims, 8 Drawing Sheets

(51) Int. Cl.
*H01M 10/48* (2006.01)
*B60L 11/18* (2006.01)
*G01R 31/36* (2006.01)

(56) References Cited

U.S. PATENT DOCUMENTS

2007/0080662 A1* 4/2007 Wu .............................. 320/110
2007/0145954 A1* 6/2007 Kawahara et al. ............ 320/150
2009/0212626 A1* 8/2009 Snyder et al. ................ 307/10.1

FOREIGN PATENT DOCUMENTS

| KR | 20040000724 A | 1/2004 |
| KR | 20070076833 A | 7/2007 |
| KR | 20080039655 A | 5/2008 |

* cited by examiner

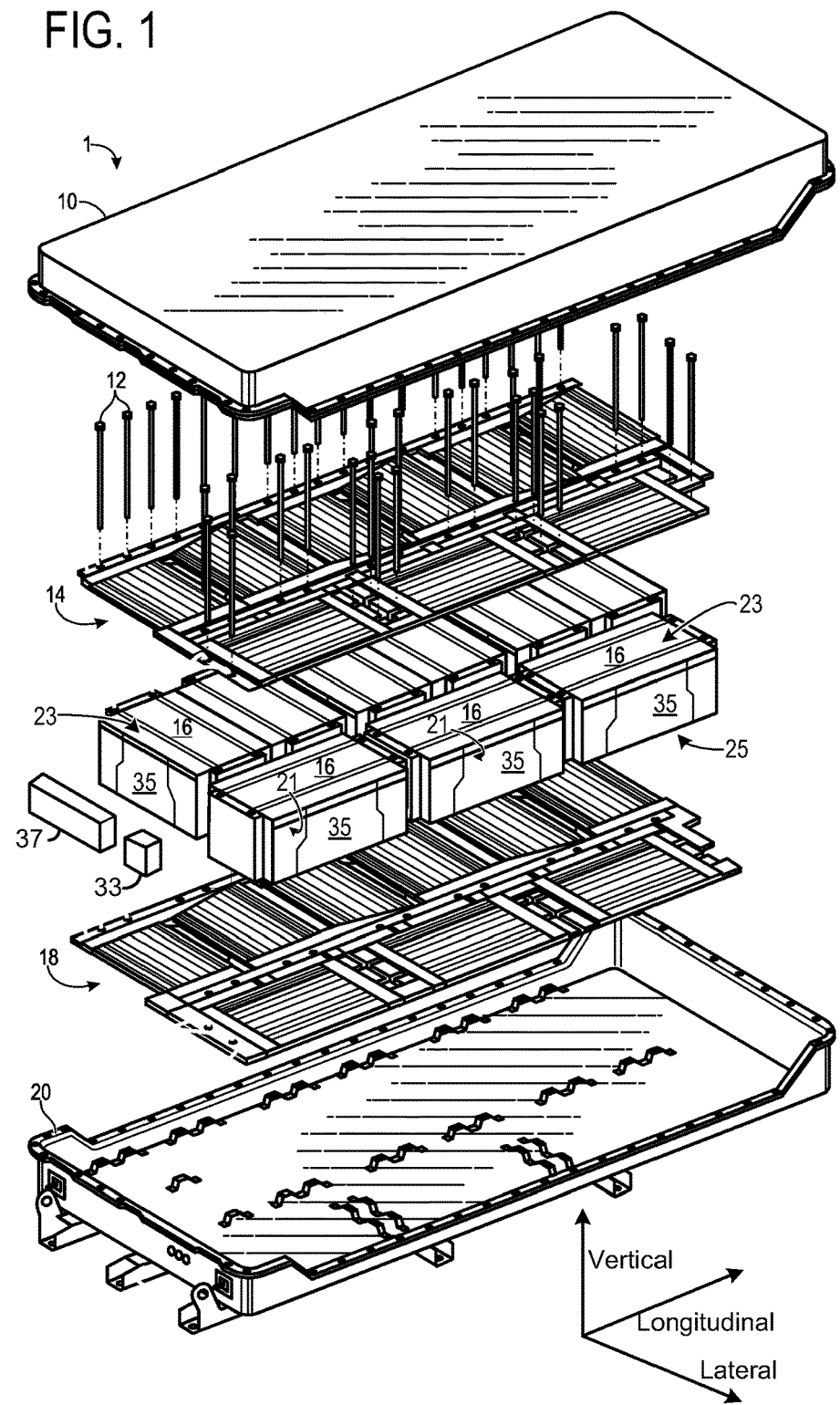

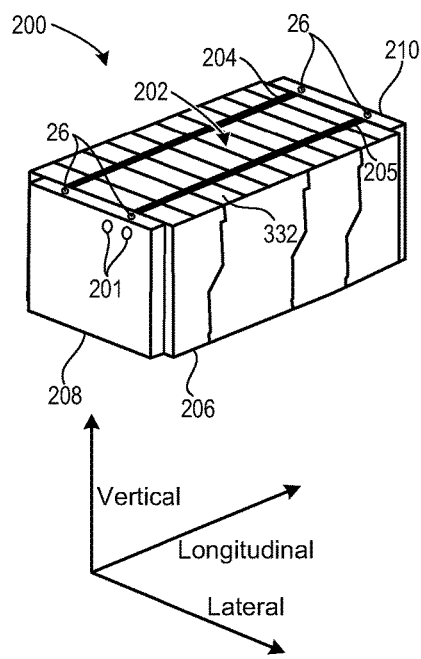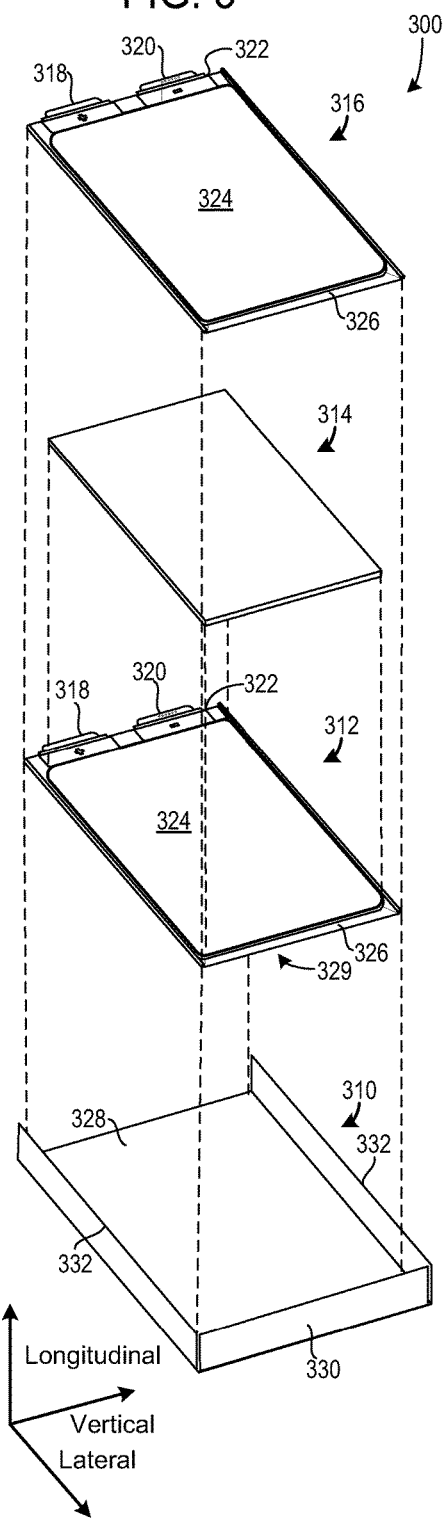

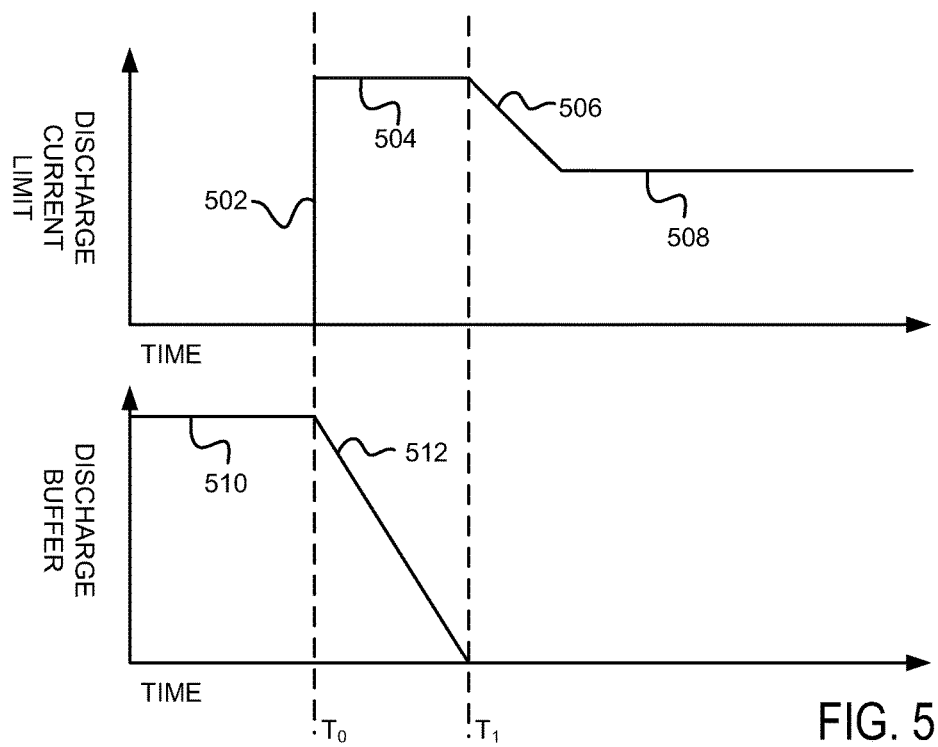
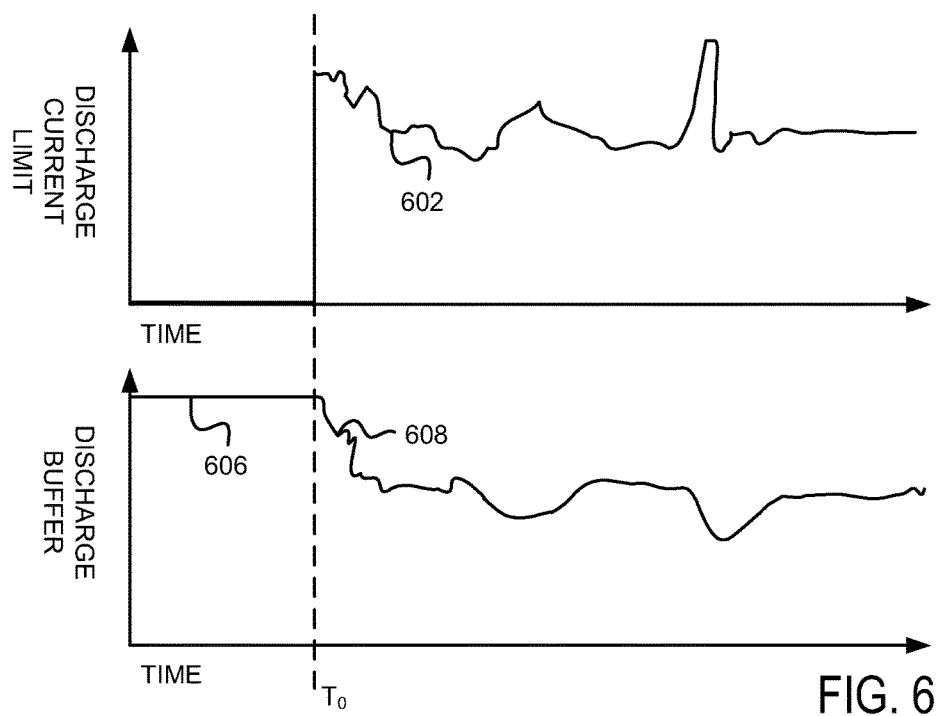
FIG. 5
FIG. 6

Vehicle Continuous Charge Current

| | 0 | 10 | 20 | 30 | 40 | 50 | 60 | 70 | 80 | 90 | 100 |
|---|---|---|---|---|---|---|---|---|---|---|---|
| 60 | 0 | 0 | 0 | 0 | 0 | 0 | 0 | 0 | 0 | 0 | 0 |
| 50 | 120 | 120 | 120 | 120 | 120 | 120 | 120 | 120 | 118 | 118 | 0 |
| 40 | 120 | 120 | 120 | 120 | 120 | 120 | 120 | 120 | 120 | 118 | 0 |
| 30 | 120 | 120 | 120 | 120 | 120 | 120 | 120 | 120 | 120 | 118 | 0 |
| 23 | 120 | 120 | 120 | 120 | 120 | 120 | 120 | 120 | 120 | 118 | 0 |
| 10 | 120 | 120 | 120 | 120 | 120 | 120 | 120 | 120 | 118 | 78 | 0 |
| 0 | 120 | 120 | 120 | 120 | 120 | 120 | 120 | 118 | 98 | 78 | 0 |
| -10 | 20 | 20 | 20 | 20 | 20 | 20 | 20 | 20 | 20 | 20 | 0 |
| -20 | 8 | 8 | 8 | 8 | 8 | 8 | 8 | 8 | 8 | 8 | 0 |
| -30 | 2 | 2 | 2 | 2 | 2 | 2 | 2 | 2 | 2 | 2 | 0 |

SOC(%)

FIG. 11

Vehicle 10-sec Charge Current

| | 0 | 10 | 20 | 30 | 40 | 50 | 60 | 70 | 80 | 90 | 100 |
|---|---|---|---|---|---|---|---|---|---|---|---|
| 60 | 0 | 0 | 0 | 0 | 0 | 0 | 0 | 0 | 0 | 0 | 0 |
| 50 | 320 | 320 | 320 | 320 | 320 | 320 | 320 | 320 | 320 | 320 | 0 |
| 40 | 320 | 320 | 320 | 320 | 320 | 320 | 320 | 320 | 320 | 314 | 0 |
| 30 | 320 | 320 | 320 | 320 | 320 | 320 | 314 | 304 | 295 | 285 | 0 |
| 23 | 320 | 320 | 320 | 319 | 305 | 294 | 284 | 275 | 267 | 258 | 0 |
| 10 | 320 | 287 | 258 | 242 | 231 | 222 | 215 | 208 | 201 | 196 | 0 |
| 0 | 307 | 243 | 218 | 205 | 196 | 188 | 182 | 175 | 170 | 166 | 0 |
| -10 | 164 | 118 | 118 | 118 | 118 | 116 | 98 | 78 | 69 | 59 | 0 |
| -20 | 74 | 64 | 57 | 54 | 53 | 51 | 48 | 47 | 46 | 44 | 0 |
| -30 | 20 | 20 | 20 | 20 | 20 | 20 | 20 | 19 | 18 | 17 | 0 |

SOC(%)

FIG. 12

SYSTEM AND METHOD FOR CONTROLLING OUTPUT OF A BATTERY PACK

CROSS REFERENCE TO RELATED APPLICATIONS

This application is a U.S. National Phase of International (PCT) Application Serial No. PCT/US2010/037712, filed Jun. 8, 2010 and entitled SYSTEM AND METHOD FOR CONTROLLING OUTPUT OF A BATTERY PACK, which claims priority from U.S. Provisional Patent Application Ser. No. 61/185,772, filed Jun. 10, 2009 and entitled BATTERY LIMIT BUFFER, the entirety of both of which are hereby incorporated herein by reference for all intents and purposes.

TECHNICAL FIELD

The present description relates to communicating an operating state of a battery pack. In one example, the battery pack provides power to a vehicle.

BACKGROUND AND SUMMARY

A battery pack may supply power to propel a vehicle. Alternatively, the battery pack may receive or sink power when the vehicle is decelerating. When a battery pack is sinking or sourcing current it has continuous current sinking and sourcing capacities as well as transient sinking and sourcing capacities. If a battery pack is supplying a relatively large amount of current during vehicle acceleration, the battery may degrade if the battery current is supplied in an amount greater than a threshold amount of current for longer than a specified time.

One way to ensure that battery does not sink or source an amount of current that is greater than the threshold amount is for the battery pack to output a signal that represents an available current limit to a vehicle controller. By knowing the battery's available current limit the vehicle controller can limit current drawn or delivered to the battery by an electric motor or inverter. In this way, the possibility of battery degradation related to a quantity of current a battery sinks or sources may be reduced.

However, even though a vehicle controller may reduce current demand on a battery in response to an available current limit signal, the vehicle driver may perceive changes in wheel torque that may be objectionable. For example, if a battery pack initially has an available current limit that corresponds to the battery's transient current limit, and the available current limit is later reduced to the battery's continuous current limit as the battery sources current at the transient limit for a prescribed time, the vehicle driver may perceive a wheel torque reduction when the available current limit changes from the transient current limit to the continuous current limit. Thus, vehicle drivability may be affected if a vehicle wheel torque is adjusted in this manner.

The inventors herein have recognized the above issues and developed an approach to address them. In one approach, a method for providing notice of battery pack availability, comprising: sourcing or sinking an amount of current from a battery pack; providing an indication of an available current limit for a battery pack; and providing an indication of a capability of said battery pack to sink or source the amount of current at said available current limit.

By providing an indication of a current limit and an indication of a capability of a battery to sink or source the amount of current at the available current limit, vehicle drivability issues related to dynamic changes in a battery pack's ability to sink or source current may be mitigated. In one example, a buffer signal is provided to a vehicle controller so that the vehicle controller can anticipate when the battery's current sourcing or sinking capability will change. The buffer signal can be related to a history of battery charge/discharge current, the present battery charge/discharge current, the transient charge/discharge current, and a ramp rate for transitioning from a transient current level to a continuous current level. Based on the signal indicating the battery available current limit and the signal representing the battery capability to supply current at the current limit, a vehicle controller can judge when to begin transitioning from a transient current level to a continuous current level. For example, a vehicle controller may determine when to limit current supplied to or drawn from a battery in response to the indicated available current limit and the indicated capability of the battery pack to sink or source current. In particular, if the battery current limit is high, but the battery capability to sink or source current is low, the vehicle controller may gradually (e.g., by ramping motor current) limit current flowing to or from the battery at a first rate. In another example, the vehicle controller may gradually limit battery current at a second rate depending on the rate of change in battery current sourcing or sinking capability as well as the present battery current sinking or sourcing capability. In another example, a vehicle controller may provide an extended amount of time (e.g., by ramping motor current at a third rate) for which current may be sourced or sunk by the battery when the level of battery current is above the continuous current limit but while the battery current is well below the available current limit. In this way, an available current limit signal and a battery capability signal may be used to improve vehicle drivability.

The present description may provide several advantages. In particular, the method can reduce battery pack degradation without having to replace hardware or rely on external systems. Further, the present description provides for additional measures of battery pack degradation protection. Further still, the level of threshold currents can be adjusted for different capability battery packs without having to change hardware and/or software.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 1 shows an exploded schematic view of a battery pack or assembly;

FIG. 2 shows a schematic view of an exemplary battery module;

FIG. 3 shows an exploded schematic view of an exemplary battery cell stack;

FIG. 5 shows a plot illustrating simulated signals of interest for improving vehicle drivability;

FIG. 6 shows a plot illustrating simulated signals of interest for improving vehicle drivability;

FIGS. 9-12 show example tables of battery pack available charging and discharging current.

DETAILED DESCRIPTION OF THE DEPICTED EMBODIMENTS

Figure 4:
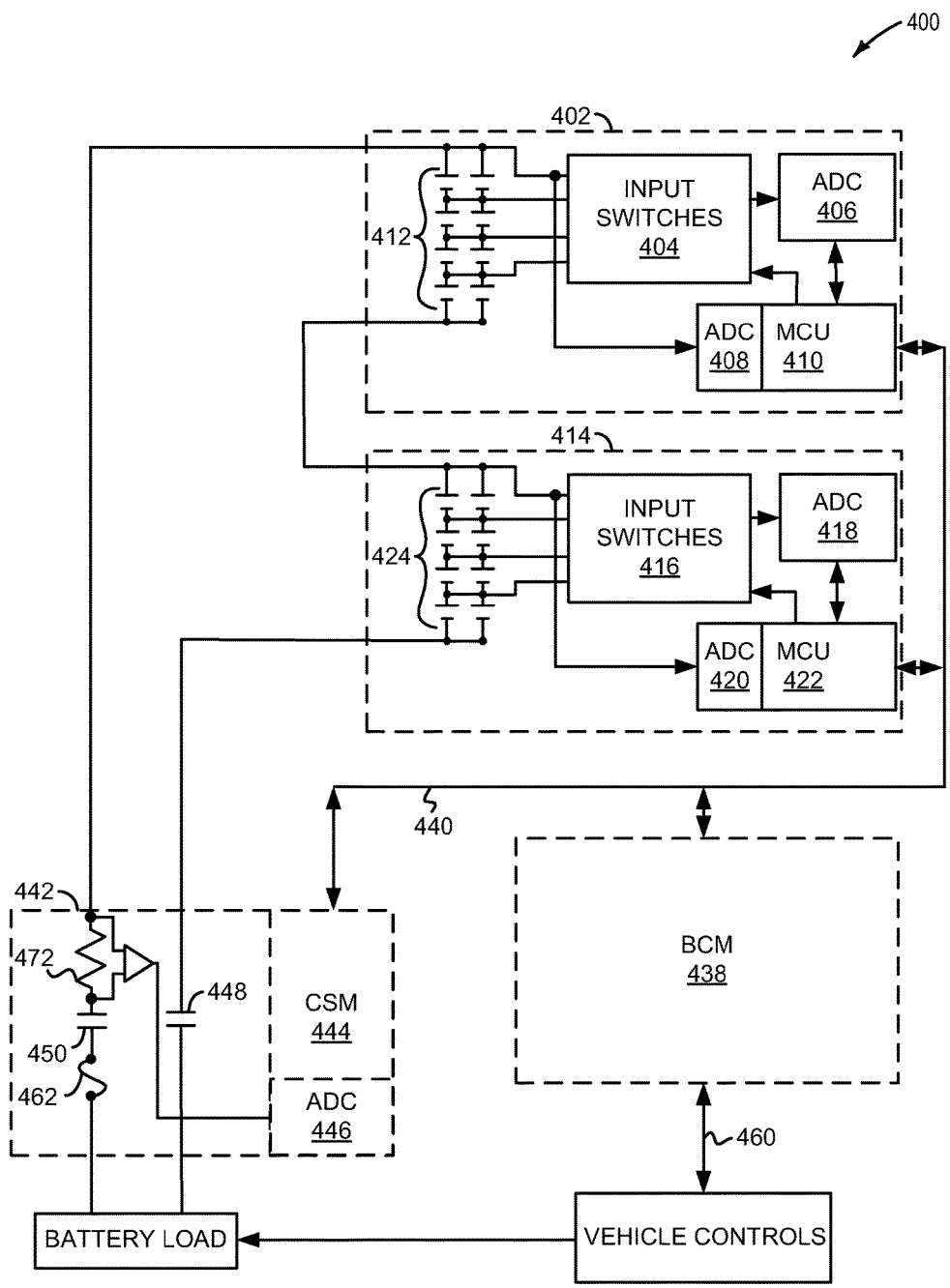
FIG. 4 shows an electrical schematic diagram for a battery pack.

The present description is related to providing one or more signals to a controller external to a battery pack to improve vehicle drivability. In one embodiment, battery cells such as those illustrated in FIGS. 2-3 may be combined in a battery pack as illustrated in FIG. 1. The power from the battery cells of FIGS. 1-3 may be selectively delivered to a load external to the battery pack via a contactor as shown in FIG. 4. In one example illustrated by the method of FIGS. 7-8, a battery pack outputs a first signal that indicates battery available current limit and a second signal indicating a capability of the battery pack to sink or source an amount of current at the available current limit. FIGS. 5-6 show example signals of interest provided by the method of FIGS. 7-8.

FIG. 1 shows an exploded view of a battery assembly 1. The battery assembly may include a cover 10, coupling devices 12, a first cooling subsystem 14 (e.g., cold plate), a plurality of battery modules 16, a second cooling subsystem 18 (e.g., cold plate), and a tray 20. The cover may be attached to the tray via a suitable coupling device (e.g., bolts, adhesive, etc.,) to form a housing surrounding the coupling devices, the cooling subsystems, and the battery modules, when assembled.

The battery modules 16 may include a plurality of battery cells configured to store energy. Although a plurality of battery modules are illustrated, it will be appreciated that in other examples a single battery module may be utilized. Battery modules 16 may be interposed between the first cooling subsystem 14 and the second cooling subsystem 18, where the battery modules are positioned with their electrical terminals on a side 21 facing out between the cooling subsystems.

Each battery module may include a first side 23 and a second side 25. The first and the second side may be referred to as the top and bottom side, respectively. The top and bottom sides may flank the electrical terminals, discussed in greater detail herein with regard to FIGS. 2-3. In this example, the top side of each battery module is positioned in a common plane in the battery assembly. Likewise, the bottom side of each battery module is positioned in another common plane in the battery assembly. However, in other examples only the top side or the bottom side of each battery module may be positioned in a common plane. In this way, the cooling subsystems may maintain direct contact with the top sides and the bottom sides of the battery modules to increase heat transfer and improve cooling capability, as described in further detail herein, wherein the cooling subsystems and the battery modules may be in face-sharing contact. Additional details of an exemplary battery module are described herein with regard to FIGS. 2-3. In alternate examples, only one of the cooling subsystems may be included in battery assembly 1, such as an upper cooling subsystem (subsystem 14 in this example). Moreover, the position, size, and geometry of the first and second cooling subsystems are exemplary in nature. Thus, the position, size, and/or geometry of the first and/or second cooling subsystems may be altered in other examples based on various design parameters of the battery assembly.

Battery assembly 1 may also include an electrical distribution module 33 (EDM), monitor and balance boards 35 (MBB), and a battery control module 37 (BCM). Voltage of battery cells in battery modules 16 may be monitored and balanced by MBBs that are integrated onto battery modules 16. Balancing battery cells refers to equalizing voltages between a plurality of battery cells in a battery cell stack. Further, battery cell voltages between battery cell stacks can be equalized. MBBs may include a plurality of current, voltage, and other sensors. The EDM controls the distribution of power from the battery pack to the battery load. In particular, the EDM contains contactors for coupling high voltage battery power to an external battery load such as an inverter. The BCM provides supervisory control over battery pack systems. For example, the BCM may control ancillary modules within the battery pack such as the EDM and cell MBB. Further, the BCM may be comprised of a microprocessor having random access memory, read only memory, input ports, real time clock, output ports, and a controller area network (CAN) port for communicating to systems outside of the battery pack as well as to MBBs and other battery pack modules.

FIG. 2 shows an exemplary battery module 200 that may be included in the plurality of battery modules 16, shown in FIG. 1. Battery module 200 may include a battery cell stack having a plurality of stacked battery cells and output terminals 201. The stacked arrangement allows the battery cells to be densely packed in the battery module.

FIG. 3 shows an exploded view of a portion of an exemplary battery cell stack 300. As shown the battery cell stack is built in the order of a housing heat sink 310, battery cell 312, compliant pad 314, battery cell 316, and so on. However, it will be appreciated that other arrangement are possible. For example, the battery cell stack may be built in the order of a housing heat sink, battery cell, housing heat sink, etc. Further in some examples, the housing heat sink may be integrated into the battery cells.

Battery cell 312 includes cathode 318 and anode 320 for connecting to a bus bar (not shown). The bus bar routes charge from one batter cell to another. A battery module may be configured with battery cells that are coupled in series and/or parallel. Bus bars couple like battery cell terminals when the battery cells are combined in parallel. For example, the positive terminal of a first battery cell is coupled to the positive terminal of a second battery cell to combine the battery cells in parallel. Bus bars also couple positive and negative terminal of battery cell terminals when it is desirable to increase the voltage of a battery module. Battery cell 312 further includes prismatic cell 324 that contains electrolytic compounds. Prismatic cell 324 is in thermal communication with cell heat sink 326. Cell heat sink 326 may be formed of a metal plate with the edges bent up 90 degrees on one or more sides to form a flanged edge. In the example of FIG. 3, two opposing sides include a flanged edge. However, other geometries are possible. Battery cell 312 is substantially identical to battery cell 316. Therefore similar parts are labeled accordingly. Battery cells 312 and 316 are arranged with their terminals in alignment and exposed. In battery module 200 shown in FIG. 2 the electric terminals are coupled to enable energy to be extracted from each cell in the battery module. Returning to FIG. 3, compliant pad 314 is interposed between battery cell 312 and battery cell 316. However, in other examples the compliant pad may not be included in the battery cell stack.

Housing heat sink 310 may be formed by a metal plate having a base 328 with the edges bent up 90 degrees on one or more sides to form a flanged edge. In FIG. 3 longitudinally aligned edge 330 and vertically aligned edges 332 are bent flanged edges. As depicted, the housing heat sink is sized to receive one or more battery cells. In other words, one or more battery cells may be positioned within base 328. Thus, the flanged edges of the battery cells may be in contact with housing heat sink and underside 329 of battery cell 312 may be in contact with the base of the housing heat sink, facilitating heat transfer.

One of the longitudinally aligned edges 332 of the housing heat sink 310 may form a portion of the top side 202 of battery module 200, as shown in FIG. 2. Similarly, one of the longitudinally aligned edges 332 may form a portion of the bottom side of the battery module. Thus, the longitudinally aligned edges of the housing heat sink may be in contact with the first and the second cooling subsystems to improve heat transfer. In this way, heat may be transferred from the battery cells to the exterior of the battery module.

The battery cells may be strapped together by binding bands 204 and 205. The binding bands may be wrapped around the battery cell stack or may simply extend from the front of the battery cell stack to the back of the battery cell stack. In the latter example, the binding bands may be coupled to a battery cover. In other embodiments, the binding bands may be comprised of threaded studs (e.g., metal threaded studs) that are bolted at the ends. Further, various other approaches may be used to bind the cells together into the stack. For example, threaded rods connected to end plates may be used to provide the desired compression. In another example, the cells may be stacked in a rigid frame with a plate on one end that could slide back and forth against the cells to provide the desired compressive force. In yet other embodiments, rods held in place by cotter pins may be used to secure the battery cells in place. Thus, it should be understood that various binding mechanisms may be used to hold the cell stack together, and the application is not limited to metal or plastic bands. Cover 206 provides protection for battery bus bars (not shown) that route charge from the plurality of battery cells to output terminals of the battery module.

The battery module may also include a front end cover 208 and a rear end cover 210 coupled to the battery cell stack. The front and rear end covers include module openings 26. However, in other examples the module openings may be included in a portion of the battery module containing battery cells.

Various methods are available to determine battery state of charge. By knowing the state of charge of a battery cell it is possible to determine whether or not the battery cell may accept additional charge. Further, by knowing the state of charge of a battery cell it is possible to determine when it is undesirable to further discharge a battery cell. One method of determining battery state of charge includes determining battery cell voltage.

Referring now to FIG. 4, a schematic diagram for controlling battery pack output is shown. In this example, battery pack 400 includes two battery cell stacks 402 and 414 as indicated by the dashed lines. Battery cells 412 and 424 are shown identically configured and are connected in series. However, battery cell stacks may be configured with different numbers of battery cells, and the battery cells may be configured differently if desired. For example, battery cells 412 and 424 are comprised of eight battery cells each. Four of the battery cells are arranged in series. Further, the four battery cells are arranged in parallel with four other battery cells that are arranged in series. In this configuration, each battery cell stack 402 and 414 outputs a voltage that is related to the number of battery cells connected in series as well as the individual voltage output of each battery cell. And, as discussed above, the current capability or amp-hour rating of the battery cell stack may be related to the number of battery cells connected in parallel. As the number of battery cells arranged in parallel increases, the battery cell stack amp-hour rating increases. As the number of battery cells arranged in series increases, the output voltage of the battery cell stack increases. Thus, the voltage output of a battery pack can be increased or decreased by changing the number of battery cells arranged in a series connection. Likewise, the battery pack amp-hour rating may be increased or decreased by changing the number of battery cells arranged in parallel. Therefore, in this example, the battery pack voltage may be increased by adding additional battery cells in series with the battery cells of battery cell stacks 402 and 414. Alternatively, the battery cell stack amp-hour rating may be increased by adding more battery cells in parallel to battery cells 412 and 524.

Battery cell stacks 402 and 414 include input switches 404 and 416 for selectively coupling ADCs 406 and 418 to battery cells 412 and 424 respectively. MCUs 410 and 422 control the state of switches 404 and 416 by way of digital outputs from the respective MCUs. Input switches 404 and 416 are configured such that ADCs 406 and 418 may be coupled to individual battery cells to measure battery cell voltage without being influenced by the voltage of battery cells that may be placed in series with the battery cell being measured. In one embodiment, each MCU 410 and 422 may couple each series connected battery cell to respective ADCs 406 and 418. When battery cells are coupled in parallel, input switches 404 and 416 couple ADCs 406 and 418 to the battery cells of a cell stack that are coupled in parallel. Thus, each ADC coupled to a battery cell stack may be configured to measure the voltage of one or more battery cells coupled in parallel within the respective battery cell stack.

ADCs 406 and 418 are configured as high resolution (e.g., 12 or 16 bit resolution ADCs) devices that are external or off chip from MCUs 410 and 418 although ADCs may be on chip in other embodiments and may have different resolutions (e.g., 8 bit resolution). In one example, ADCs 406 and 418 communicate with MCUs 410 and 422 respectively by way of SPI ports. The SPI ports are used to transfer battery cell voltages to each MCU as the individual MCUs command input switches 404 and 416 to cycle through battery cells 412 and 424 respectively. By cycling through the switches, individual series battery cells are coupled to ADCs 406 and 418 for determining battery cell voltages.

ADCs 408 and 420 are lower resolution (e.g., 8 bit resolution) devices that are integrated to MCUs 410 and 422. In alternate embodiments, ADCs 408 and 420 may be of higher resolution (e.g., 12 or 16 bit resolution) and external from MCUs 410 and 422. ADCs 408 and 420 are configured to measure the series voltage provided by battery cells 412 and 424 for the respective battery cell stacks 402 and 414. For example, ADC 408 is configured to measure the voltage provided by the series combination of four battery cells coupled in parallel to four other battery cells, the battery cells indicated at 412. Thus, the ADC of an MBB is configured to measure the series combination of battery cells of a battery cell stack. Of course, an ADC of a MBB coupled to a battery cell stack may be configured to measure the voltage of additional or fewer battery cells than the four battery cells shown in FIG. 4. Further, as discussed above, the series combination of battery cells 412 acts to increase the output voltage of the battery cell stack 402.

MCUs 410 and 422 control input switches 404 and 416 as well as ADCs 406 and 408, 418, and 420. Further, MCUs 410 and 422 may store the respective battery voltages to memory and perform arithmetic and logical operations on battery voltage data captured by ADCs 406, 408, 418, and 420.

BCM 438 communicates with MCUs 410 and 422 of battery cell stacks 402 and 414 by way of CAN bus 440. BCM 438 may acquire battery voltages and status indicators (e.g., flags that indicate degradation of an ADC, battery cell, or MCU) from battery cell stacks 402 and 414. BCM 438 also communicates with EDM 442 via hardwired digital inputs and outputs for opening and closing contactors 450 and 448. In an alternative embodiment, BCM 438 may communicate to EDM 442 via CAN 440 for sending instructions to close contactors 450 and 448 when it is determined to couple battery cell stacks 402 and 414 to the battery load or source. Contactors 450 and 448 act as electrically controlled switches and do not interrupt short circuit current without instruction from BCM 438. In one example, contactors 450 and 448 are normally open and include a closing coil and metallic contacts that may be engaged and disengaged with metallic current carrying conductors by operating the closing coil. In one example, the contactors open by physically moving apart. In other examples where battery power requirements are lower, a silicon contactor such as a FET or IGBT may be used.

CSM 444 includes an ADC 446 for measuring battery pack current on the battery side of contactors 450 and 448. Current shunt 462 provides a voltage that is proportional to current flow entering or exiting the battery pack to a microcontroller within CSM 444. The CSM microcontroller converts battery pack current into digital data via ADC 446. The CSM microcontroller transmits current data to BCM 438 via CAN bus 440 or an alternate type of communication link (e.g. PWM link or FlexRay link). BCM 438 also communicates with a vehicle controller via CAN bus 460. BCM 438 may communicate a variety of battery related information to a vehicle controller via CAN bus 460. For example, BCM 438 can send an indication of available battery current capability and/or an indication of battery current sinking or sourcing capability. Fuse 462 provides current limiting protection to the battery pack.

Thus, the system of FIG. 4 provides for a system for providing notice of battery pack availability, comprising: a plurality of battery cells; a communication link; a current sensor in electrical communication with said plurality of battery cells; a first module including a first controller, said first controller including instructions for communicating a sensed battery pack current data in a digital format to a second module via said communication link, said sensed battery pack current retrieved from said current sensor; and a second module including a second controller, said second controller including instructions for receiving said battery pack current data in said digital format via said communication link, said second controller including further instructions for providing an indication of an available current limit for a battery pack to a vehicle controller, and said second controller including further instructions for providing a indication of a capability of said battery pack to sink or source a sensed battery pack current at said available current limit to said vehicle controller. The system provides for where the second module is a battery control module, and where the battery control module is electrically coupled to a plurality of monitor and balancing modules via said communication link. The system also includes where the second controller includes further instructions for filtering said battery pack current data. In one example, the system includes where the second controller provides further instructions for adjusting the indication of said capability of the battery pack to sink or source said amount of current in response to a temperature of said battery pack. The system also includes where the second controller provides for instructions for adjusting the indication of the capability of the battery pack to sink or source the amount of current in response to a state of charge of the battery pack. The system also includes where the capability of the battery pack to sink an amount of current increases as a state of charge of the battery pack decreases.

Figure 7:
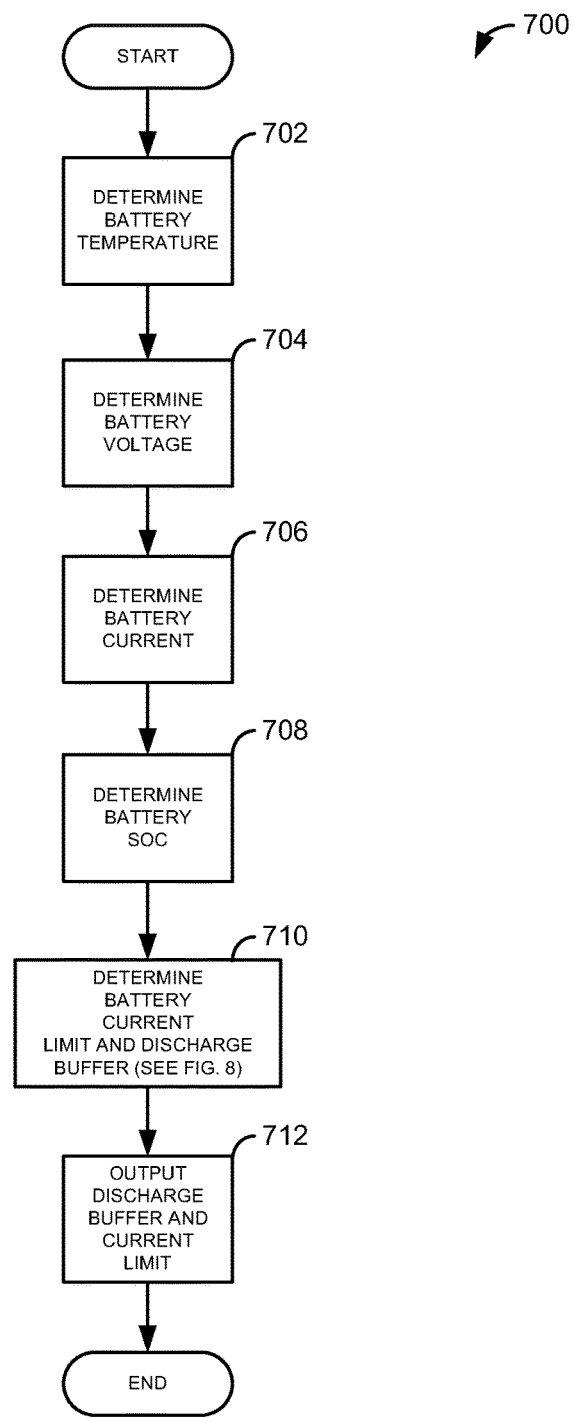
FIG. 7 shows a flowchart of a method for communicating battery state to a vehicle controller.
Figure 8:
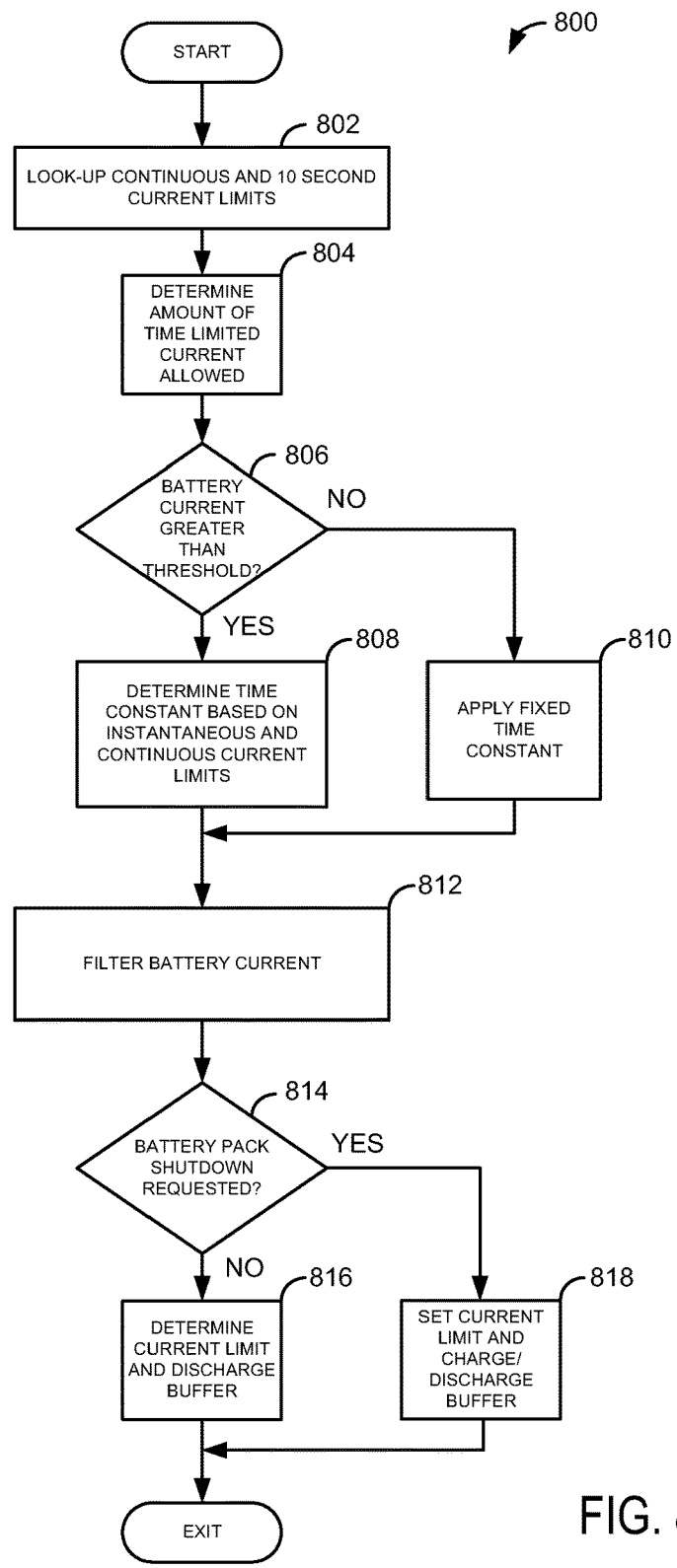
FIG. 8 shows a flowchart of a method for providing a battery current limit signal and a battery capability signal.

Referring now to FIG. 5, a plot illustrating simulated signals of interest for improving vehicle drivability is shown. The methods of FIGS. 7-8 provide for the illustrated signals. The first plot from the top of FIG. 5 is a plot of a battery discharge current limit versus time. Trace 502 represents an available discharge current limit amount at a particular point in time. An available battery discharge current limit is a battery current level that the battery controller does not want exceeded while the battery is discharging. For example, if a battery is fully charged and has delivered only a small amount of current, the available battery discharge current limit may correspond to the battery's transient current limit. In one example, the battery transient current limit is an amount of current that the battery is capable of supplying for a specified short term interval (e.g., 5, 10, 15, 20, 25, or 30 seconds). On the other hand, if a battery has sourced some current (e.g., the battery's transient limit for a prescribed time period), the available battery discharge current limit may correspond to the battery's continuous current limit. In one example, the battery continuous current limit is an amount of current that the battery is capable of supplying for a specified longer term interval (e.g., 45, 50, 55, 60, 65, 70, 75 or more seconds). Alternatively, an available battery charging current limit versus time may be represented by a similar plot.

The X-axis represents time and time increases from left to right. The Y-axis represents the battery discharge current limit and the battery discharge current limit increases from bottom to top in the direction of the Y-axis arrow.

The second plot from the top of FIG. 5 represents discharge buffer size or alternatively referred to as a capability of a battery pack to source an amount of current at the available current limit. The buffer signal provides the vehicle controller with some look-ahead visibility as to when the available battery current limit will change from the instantaneous battery current limit to the continuous battery current limit. Trace 510 represents the capability of the battery pack to source current at the available battery discharge current limit. Alternatively, a battery charging current capability versus time may be represented by a similar plot. A battery capability to source an amount of current at the available battery discharge current limit having a value of zero indicates that the available current limit will be reduced at a predetermined rate until the continuous battery current rating is reached. A battery capability that has a value greater than zero represents the capability of the battery to supply current at the level indicted by the discharge current limit. Note that the battery buffer or capability signal does not represent the state of battery charge. The X-axis represents time and increases from the left to the right. The Y-axis represents a capability of a battery pack to source an amount of current at the available current limit.

At time to the left of $T_0$, the discharge current limit is at zero when the battery pack is in a rest state (e.g., during a power down). At the same time, the discharge buffer signal 510 or the battery capability signal is at a high level which indicates that the battery is charged and able to supply current. Alternatively, for a similar plot representing a charging buffer, the charging buffer signal may be at a high level when a battery is in a discharged state and ready to accept current. Thus, the level of the discharge buffer signal can be dependent on whether the battery is in a charging or discharging mode. It should be noted that separate signals for battery capability charging and discharging may be provided.

At $T_0$, the battery pack exits a rest state and begins to supply current to an external load. Further, discharge current limit signal 502 goes to a higher level (e.g., the 10 second transient discharge current level) at 504 indicating that the battery is able to source a relatively higher level of current. In an alternative example, the higher level indicates that the battery is able to sink a relatively high level of current (e.g., the 10 second transient charging level). As current is supplied from the battery pack, the discharge buffer signal or battery capability to source battery current at the available battery current limit signal 510 begins to decline at 512 indicating that the battery's ability to supply current at the higher level is declining as current is being drawn from the battery. The battery capability for supplying current continues to decline until $T_1$ at which time the battery capability signal is zero. Thus, the battery capability to source current at the available current limit, or the buffer signal, indicates that the battery may not continue supply current at the higher level (e.g., the 10 second sourcing level). As a result, the available current limit will be ramped at a predetermined rate to the continuous current limit.

At $T_1$, the discharge current limit is ramped at 506 toward the battery continuous current limit at 508. The ramp rate may be different for different battery operating conditions. For example, if the battery temperature is lower, the current limit may be ramped at a first rate. If the battery temperature is higher, the current limit may be ramped at a second rate, the second rate faster than the first rate. The battery pack is capable of supplying current at the continuous rated current when the battery continuous current limit is reached at 508. However, it should be noted that the discharge buffer or battery capability signal to source battery current at the battery available current amount may begin to increase if a battery current amount is reduced to a level less than the battery continuous rated current. In one example, a hysteresis band is included around the continuous rated current so that the buffer does not start to increase when the current drawn is near the continuous rated current.

Referring now to FIG. 6, a plot illustrating simulated signals of interest for improving vehicle drivability is shown. The methods of FIGS. 7-8 provide for the illustrated signals. The first plot from the top of FIG. 6 is a plot of a battery discharge current limit versus time. Trace 602 represents the discharge current limit amount. A battery discharge current limit is a battery current level that the battery controller does not want exceeded while the battery is discharging. The X-axis represents time and the amount of time increases from left to right. The Y-axis represents the battery discharge current limit and increases from bottom to top in the direction of the Y-axis arrow.

The second plot from the top of FIG. 6 represents discharge buffer size or alternatively referred to as a capability of a battery pack to source an amount of current at the available current limit. Trace 606 represents the capability of the battery pack to source current at the available current limit. Alternatively, a battery charging current capability versus time may be represented by a similar plot. A battery capability to source an amount of current at the available current limit having a value of zero indicates that the available current limit will be reduced at a predetermined rate until the continuous battery current rating is reached. A battery capability that has a value greater than zero represents the capability of the battery to supply current at the level indicted by the discharge current limit. The X-axis represents time and increases from the left to the right. The Y-axis represents a capability of a battery pack to source an amount of current at the available current limit.

At time to the left of $T_0$, the discharge current limit is at zero when the battery pack is in a rest state (e.g., during a power down). At the same time, the discharge buffer signal 606 or the battery capability signal is at a higher level which indicates that the battery is charged and able to supply current.

At $T_0$ the battery pack exits a rest state and begins to supply current to an external load. The discharge current limit signal 602 goes to a higher level and then varies after $T_0$. The discharge current limit can vary with operating conditions as the temperature, current demand, and other related variables change. At the right of $T_0$, the discharge buffer signal or battery capability signal also starts to trend lower. The battery capability signal can trend lower as the amount of current drawn from the battery increases. In addition, the capability signal can also trend lower as a result of increasing battery temperature. It should be noted that after $T_0$ battery buffer signal 606 increases and decreases indicating that the battery's capability to source current at the transient limit (e.g., the 10 second current limit) may vary with operating conditions. Marker 608 illustrates one point in time where the battery capability briefly increases.

Referring now to FIG. 7, a flowchart of a method of communicating battery state of charge to a vehicle controller is shown. At 702, routine 700 determines a battery temperature. Battery temperature may be determined via a thermistor or similar temperature sensing device. In one example, a single temperature of a battery may be determined. In other examples, an average of a plurality of battery temperatures (e.g., an average or a plurality of battery cell temperatures) may be taken to determine battery temperature. Routine 700 proceeds to 704 after battery temperature is determined.

At 704, routine 700 determines a battery voltage. Battery voltage may be determined by measuring the battery voltage at an output contactor (e.g., output contactor 450 at FIG. 4). A battery voltage may be determined from an output of an ADC. In another example, a battery voltage may be determined from a summation of a plurality of battery module output voltages. For example, BCM 438 of FIG. 4 may sum voltages from battery modules 402 and 414 to determine a total battery voltage. Routine 700 proceeds to 706 after battery voltage is determined.

At 706, routine 700 determines battery pack current. In one example, battery current is determined from a voltage that develops across a shunt resistor that is in an EDM module (e.g., see FIG. 4 at 472). Routine 700 proceeds to 708 after battery current is determined.

At 708, routine 700 determines battery state of charge. In one example, the battery state of charge may be determined according to the method described in U.S. patent application Ser. No. 12/477,382, filed Jun. 3, 2009, the contents of which are hereby fully incorporated by reference in their entirety for all intents and purposes. In another example, the state of charge may be determined solely from the battery voltage. Routine 708 proceeds to 710 after battery state of charge is determined.

At 710, routine 700 determines the battery discharge current limit and the battery discharge buffer. In one example, routine 700 determines the battery current limit and battery discharge buffer according to the method of FIG. 8. Routine 700 proceeds to 712 after the battery discharge current limit and battery discharge buffer are determined.

At 712, routine 700 outputs the battery discharge current limit and the battery discharge buffer or battery capability. In one example, routine 700 outputs the battery discharge current limit and battery discharge buffer or capability to a vehicle controller via a CAN link or other type of communication link (e.g., PWM signal). In particular, digital representations of the battery discharge current limit and the battery discharge capability or buffer are converted to a digital representation and output to the vehicle controller via the CAN bus. In another example, the battery discharge current limit and battery discharge capability may be output as analog or digital signals. Routine 700 exits after outputting the battery capability and the battery current limit to the vehicle controller.

In an additional example, routine 700 may be reconfigured to determine and output the battery charging current limit and the battery charging buffer or battery charging capability. For example, the transient discharging current can be replaced by transient charging current while continuous discharging current can be replaced by continuous charging current. Thus, similar routines for determining discharging and charging current limits as well as discharging and charging buffers are provided.

Referring now to FIG. 8, a flowchart of a method for providing a battery current limit signal and a battery capability signal is shown. At 802, routine 800 looks-up continuous (e.g., 60 second current rating) and instantaneous (e.g., 10 second current rating) current ratings. Continuous and instantaneous current ratings are stored in two dimensional tables that are indexed by battery temperature and battery state of charge. Further, separate tables are provided for charging and discharging current (e.g., see FIGS. 9-12). The output of the tables is a transient current (e.g., 10 second) sourcing limit, a continuous current (e.g., 60 second) sourcing limit, a transient (e.g., 10 second) current sinking limit, and continuous current (e.g., 60 second) sinking limit. Routine 800 proceeds to 804 after the continuous and 10 second currents are determined from look-up tables.

At 804, routine 800 determines an amount of time the current limit sourced or sunk by the battery pack is allowed based on the instantaneous and continuous currents determined at 802. In one example, the time allocated for continuous current rating is 60 seconds while the time allocated for transient current rating is 10 seconds. Thus, the current amount for the transient current is rated for 10 seconds while the current amount for the continuous current is rated for 60 seconds. Thus, if the present current amount is less than the constant current rating the interpolation outputs 60 seconds. If the present current amount is greater than the continuous current rating but less than the transient current rating, interpolation yields an amount of time between 10 and 60 seconds. If the present current amount is greater than the 10 second current rating, routine 800 extrapolates past the 10 second time up to a minimum of 0.1 seconds. Routine 800 proceeds to 806 after determining an amount of time the present battery current is allowed.

At 806, routine 800 determines whether or not the present battery current is greater than a threshold amount. In one example, the threshold amount corresponds to the battery continuous current determined at 802. If the battery current is greater than a threshold amount, routine 800 proceeds to 808. Otherwise, routine 800 proceeds to 810.

At 808, routine 800 determines a filter time constant for a filter. The filter is an infinite impulse response filter (IIR) that accounts for prior battery current and present battery current when determining the battery capability for sourcing current at the available battery current limit or the battery buffer amount.

The IIR filter has a time constant that is related to the continuous battery discharge current. In particular, the filter time constant is calculated according to the following equation:

$$\mathrm{dis}\_\tau = \frac{\left(\frac{\mathrm{MAX}[0.0, (\mathrm{dis\_lim\_10} - (-ibat))]}{\mathrm{dis\_rate\_dec}} - \mathrm{dis\_time}\right)}{\left(\ln\left(1 - \frac{\mathrm{dis\_lim\_cont}}{-ibat}\right)\right)}$$

Where dis_$\tau$ is the filter time constant, dis_lim_10 is the transient discharge current limit (e.g., the 10 second discharge current limit), ibat is the battery current, des_rate_dec is the ramp rate for transitioning between the transient current limit and the continuous current limit, dis_time is the time allowed for transitioning between the transient current and the continuous current as determined at 804, dis_lim_cont is the continuous current discharge limit. Routine 800 proceeds to 812 after the filter time constant is determined.

At 810, routine 800 determines a time constant from a calibrated variable. In one example, the calibrated may be empirically determined from experimentation. Once the time constant is determined it is stored in memory and retrieved as needed. Routine 810 proceeds to 812 after the filter time constant is determined.

At 812, routine 800 processes the present battery current through the IIR filter. In one example, the IIR filter is implemented as a first order low pass filter. For example, the following filter may be implemented at 812:

dis_$fk$=1−exp($dT$/dis_$\tau$)

IIR(new)=dis_$fk$·ibat+(1−dis_$fk$)·IIR(old)

Where IIR(new) is the filter output of battery current, dis_$\tau$ is the filter time constant, IIR(old) is the previous filter output, and dis_fk is the unitless filter coefficient, dT is the rate that the calculation is executed. Of course, other filters are anticipated and may be implemented at 812. Routine 800 proceeds to 814 after the present battery current is filtered.

At 814, routine 800 judges whether or not a battery shut-down request has been made. If so, routine 800 proceeds to 818. Otherwise, routine 800 proceeds to 816.

At 816, routine 800 determines the battery current limit and a discharge buffer or battery capability. During the first execution of routine 800 the battery discharge current limit is set to the battery's transient current limit (e.g., the 10 second current limit). During subsequent executions of routine 800, the battery discharge current limit is adjusted in response to the filtered battery current determined at 812. In particular, if the value of the filtered current is greater than the continuous current discharge limit, routine 800 ramps the battery discharge current limit from the present value at a predetermined rate toward the continuous battery discharge current. On the other hand, if the filtered battery current is less than the continuous battery discharge current limit routine 800 ramps the battery discharge current value from the present value at a predetermined rate toward the battery transient discharge current limit. In this way, an indication of the available battery discharge current limit is determined by routine 800. A similar algorithm is applied when the battery is in a charging state to provide a battery charging current limit; however, the parameters are representative of battery charging rather than battery discharging as is discussed above.

At 816, routine 800 also determines an indication of the battery buffer or alternatively referred to as a battery's capability to source current at the available current sourcing limit. Similarly, an alternative routine can determine the battery's current sinking buffer. In one example the battery buffer is determined according to the following equation:

$$\text{dis\_buf} = 100 \cdot \left(1 - \left(\frac{IIR}{\text{dis\_lim\_cont}}\right)\right)$$

Where dis_buf is the buffer current or the capability of the battery pack to sink or source the amount of current at the available current limit, IIR is the filtered battery current, and dis_lim_cont is the battery continuous discharge current limit. Routine 800 proceeds to exit after the battery current limit and the battery buffer are determined.

At 818, routine 800 transitions the filtered battery current to the continuous battery current limit and ramps the battery available current limit to the battery continuous battery current limit. By transitioning the filtered battery current to the continuous battery current limit, the battery buffer signal goes to zero. Routine 800 proceeds to exit after the battery current limit and battery available current limit are transitioned.

Thus, the method of FIGS. 7-8 provide for a method for providing notice of battery pack availability, comprising: sourcing or sinking an amount of current from a battery pack; providing an indication of an available current limit for a battery pack; and providing an indication of a capability of said battery pack to sink or source the amount of current at said available current limit. In one example, the method provides for the indication of the capability of the battery pack to sink or source an amount of current in response to a state of charge of the battery pack and a temperature of the battery pack. The method includes where the indication of the capability of the battery pack to sink or source an amount of current is related to a continuous battery current capability and a transient battery current capability. The method includes where the transient battery current capability is a 10 second current capability. The method also includes where the battery pack has a sourcing current capability that is greater than a sinking current capability when the battery pack is at substantially a same temperature when sourcing and sinking current. The method includes where the indication of the capability of the battery pack to sink or source and amount of current is supplied by a battery pack controller to a vehicle controller via a communication link. In one example, the method provides for an indication of the capability of the battery pack to sink or source an available amount of current is related to an amount of current sensed entering or exiting said battery pack.

In another example, the method of FIGS. 7-8 provide for a method for providing notice of battery pack availability, comprising: sensing current entering or exiting a battery pack; providing an indication of an available current limit for a battery pack in response to said sensed current; and providing an indication of a capability of said battery pack to sink or source the sensed amount of current at said available current limit, said indication of said capability of said battery pack to sink the sensed amount of current reduced as a state of charge of said battery pack increases, said indication of said capability of said battery pack to source said amount of current increased as a state of charge of said battery pack increases. The method also includes where the current is sensed by a first module and communicated to a second module, and wherein the second module communicates said indication of said capability of the battery pack to a vehicle controller via a communication link. In one example, the method further comprises adjusting said indication of said capability of said battery pack to sink or source an amount of current in response to a state of charge of said battery pack. The method also comprises adjusting the indication of the capability of the battery pack to sink or source an amount of available current in response to a temperature of the battery pack. The method includes where the indication of the capability of the battery pack to sink or source an amount of current is adjusted by a predetermined amount during a battery pack shutdown. The method further includes where the indication of the capability of the battery pack to sink or source an amount of current is related to a continuous battery current capability and a transient battery current capability. The method comprises where the available current limit is reduced at a prescribed rate when the indication of the capability of said battery pack to sink or source an amount of current is substantially zero.

Figure 9:
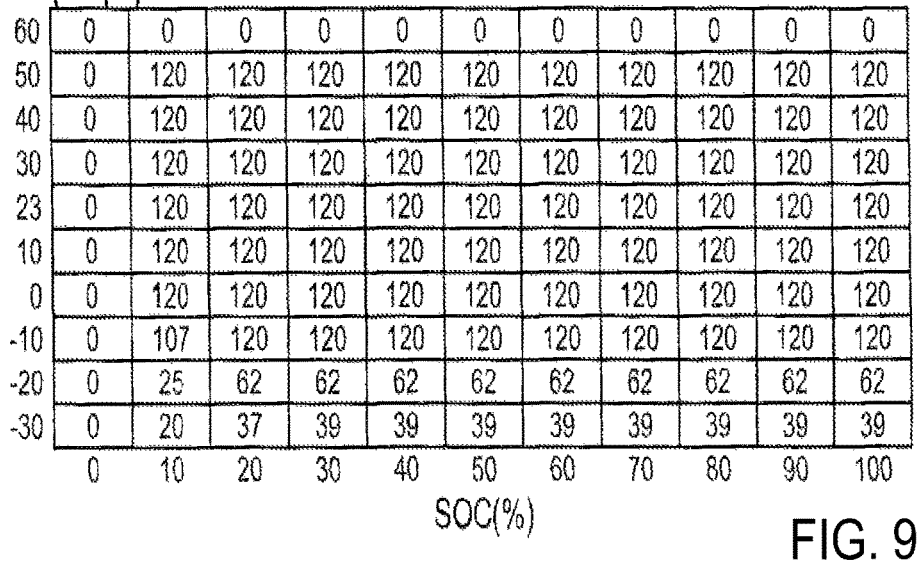

Referring now to FIG. 9, a table of battery continuous discharge current is shown. The table contains values of continuous discharge current in amps. The table is indexed along the X-axis according to the present level of battery state of charge. The table is indexed along the Y-axis according to the present battery temperature. The table indicates that the continuous battery discharge current increases as the battery state of charge increases with exceptions at the extents of the table. The table of FIG. 9 may be interrogated by the methods of FIGS. 7-8.

Figure 10:
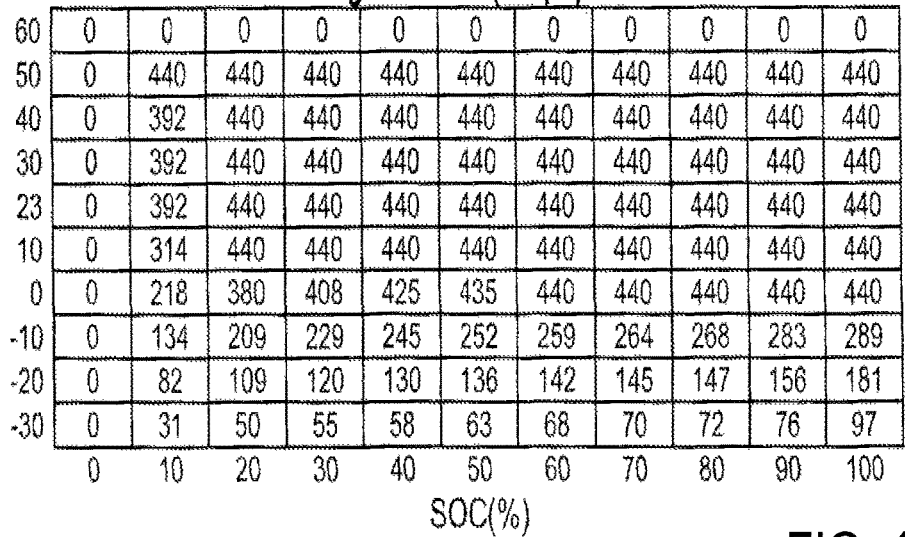

Referring now to FIG. 10, a table of battery transient discharge current is shown. The table contains values of transient or 10 second discharge current in amps. The table is indexed along the X-axis according to the present level of battery state of charge. The table is indexed along the Y-axis according to the present battery temperature. The table indicates that the transient battery discharge current increases as the battery state of charge increases with exceptions at the extents of the table. The table of FIG. 10 may be interrogated by the methods of FIGS. 7-8.

Referring now to FIG. 11, a table of battery continuous charging current is shown. The table contains values of charging current in amps. The table is indexed along the X-axis according to the present level of battery state of charge. The table is indexed along the Y-axis according to the present battery temperature. The table indicates that the continuous battery charging current decreases as the battery state of charge increases with exceptions at the extents of the table. The table of FIG. 11 may be interrogated by the methods of FIGS. 7-8.

Referring now to FIG. 12, a table of battery transient discharge current is shown. The table contains values of transient or 10 second discharge current in amps. The table is indexed along the X-axis according to the present level of battery state of charge. The table is indexed along the Y-axis according to the present battery temperature. The table indicates that the transient battery charging current decreases as the battery state of charge increases with exceptions at the extents of the table. The table of FIG. 12 may be interrogated by the methods of FIGS. 7-8.

The subject matter of the present disclosure includes all novel and nonobvious combinations and subcombinations of the various systems and configurations, and other features, functions, and/or properties disclosed herein.

As will be appreciated by one of ordinary skill in the art, routines described in FIGS. 7-8 may be represented by instructions for a controller and may be represented by one or more of any number of processing strategies such as event-driven, interrupt-driven, multi-tasking, multi-threading, and the like. As such, various steps or functions illustrated may be performed in the sequence illustrated, in parallel, or in some cases omitted. Likewise, the order of processing is not necessarily required to achieve the objects, features, and advantages described herein, but is provided for ease of illustration and description. Although not explicitly illustrated, one of ordinary skill in the art will recognize that one or more of the illustrated steps or functions may be repeatedly performed depending on the particular strategy being used.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for providing notice of battery pack availability, comprising:
   sourcing or sinking an amount of current from a battery pack;
   providing an indication of an available current limit for a battery pack; and
   providing an indication of a capability of said battery pack to sink or source the amount of current at said available current limit, and where the capability of said battery pack to sink or source the amount of current is not a state of battery charge.

2. The method of claim 1, wherein said indication of said capability of said battery pack to sink or source an amount of current is responsive to a state of charge of said battery pack and a temperature of said battery pack.

3. The method of claim 1, wherein indication of said capability of said battery pack to sink or source an amount of current is related to a continuous battery current capability and a transient battery current capability, and where said capability of said battery pack to sink or source the amount of current is output to a vehicle controller.

4. The method of claim 3, wherein transient battery current capability is a 10 second current capability.

5. The method of claim 1, wherein said battery pack has a sourcing current capability that is greater than a sinking current capability when said battery pack is at substantially a same temperature when sourcing and sinking current, and where the available current limit is a battery continuous current limit when said capability of said battery pack to sink or source the amount of current is zero.

6. The method of claim 1, wherein indication of said capability of said battery pack to sink or source an amount of current is supplied by a battery pack controller to a vehicle controller via a controller area network link.

7. The method of claim 1, wherein said indication of said capability of said battery pack to sink or source an available amount of current is related to an amount of current sensed entering or exiting said battery pack.

8. A method for providing notice of battery pack availability, comprising:
   sensing current entering or exiting a battery pack;
   providing an indication of an available current limit for a battery pack in response to said sensed current, where the available current limit is based on a ratio of filtered battery pack current and a continuous discharge limit of the battery pack; and
   providing an indication of a capability of said battery pack to sink or source the sensed amount of current at said available current limit, said indication of said capability of said battery pack to sink the sensed amount of current reduced as a state of charge of said battery pack increases, said indication of said capability of said battery pack to source said amount of current increased as a state of charge of said battery pack increases.

9. The method of claim 8, wherein said current is sensed by a first module and communicated to a second module, and wherein said second module communicates said indication of said capability of said battery pack to a vehicle controller via a controller area network link.

10. The method of claim 8, further comprising adjusting said indication of said capability of said battery pack to sink or source an amount of current in response to a state of charge of said battery pack, and where the available current limit is a battery continuous current limit when said capability of said battery pack to sink or source the amount of current is zero.

11. The method of claim 8, further comprising adjusting said indication of said capability of said battery pack to sink or source an amount of available current in response to a temperature of said battery pack, and where the capability of said battery pack to sink or source the amount of current is not a state of battery charge.

12. The method of claim 8, wherein said indication of said capability of said battery pack to sink or source an amount of current is adjusted by a predetermined amount during a battery pack shutdown.

13. The method of claim 8, wherein said indication of said capability of said battery pack to sink or source an amount of current is related to a continuous battery current capability and a transient battery current capability.

14. The method of claim 8, wherein said available current limit is reduced at a prescribed rate when said indication of said capability of said battery pack to sink or source an amount of current is zero.

15. A system for providing notice of battery pack availability, comprising:
   a plurality of battery cells;
   a communication link;
   a current sensor in electrical communication with said plurality of battery cells;
   a first module including a first controller, said first controller including instructions for communicating a sensed battery pack current data in a digital format to a second module via said communication link, said sensed battery pack current retrieved from said current sensor; and a second module including a second controller, said second controller including instructions for receiving said battery pack current data in said digital format via said communication link, said second controller including further instructions for providing an indication of an available current limit for a battery pack to a vehicle controller, and said second controller including further instructions for providing an indication of a capability of said battery pack to sink or source a sensed battery pack current at said available current limit to said vehicle controller, where the capability of said battery pack to sink or source a sensed battery pack current is not a state of battery charge.

16. The system of claim 15, wherein said second module is a battery control module, and wherein said battery control module is electrically coupled to a plurality of monitor and balancing modules via said communication link.

17. The system of claim 15, wherein said second controller includes further instructions for filtering said battery pack current data, and further instructions for adjusting said available current limit to a battery continuous current limit when said capability of said battery pack to sink or source the amount of current is zero.

18. The system of claim 15, wherein said second controller includes further instructions for adjusting said indication of said capability of said battery pack to sink or source said amount of current in response to a temperature of said battery pack.

19. The system of claim 15, wherein said second controller includes further instructions for adjusting said indication of said capability of said battery pack to sink or source said amount of current in response to a state of charge of said battery pack.

20. The system of claim 15, wherein said indication of said capability of said battery pack to sink an amount of current increases as a state of charge of said battery pack decreases.

* * * * *